United States Patent
Swenson et al.

(10) Patent No.: US 6,919,532 B2
(45) Date of Patent: Jul. 19, 2005

(54) METHOD OF FORMING DIMENSIONALLY PRECISE SLOTS IN RESILIENT MASK OF MINIATURE COMPONENT CARRIER

(75) Inventors: Edward J. Swenson, Portland, OR (US); John D. Stackpole, Klamath Falls, OR (US); Yunlong Sun, Beaverton, OR (US); Manoj Sammi, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 108 days.

(21) Appl. No.: 10/678,951

(22) Filed: Oct. 3, 2003

(65) Prior Publication Data

US 2004/0108304 A1 Jun. 10, 2004

Related U.S. Application Data

(60) Provisional application No. 60/416,311, filed on Oct. 4, 2002.

(51) Int. Cl.[7] ............................................. B23K 26/00
(52) U.S. Cl. .............................. 219/121.69; 219/121.68; 219/121.67
(58) Field of Search ....................... 219/121.69, 121.68, 219/121.67, 121.85

(56) References Cited

U.S. PATENT DOCUMENTS

| | | |
|---|---|---|
| 5,226,382 A | 7/1993 | Braden ........................ 118/406 |
| 5,540,317 A | 7/1996 | Braden et al. ............... 198/393 |
| 5,673,799 A | 10/1997 | Braden ........................ 209/574 |
| 5,814,894 A | 9/1998 | Igarashi et al. ............. 257/787 |
| 5,863,331 A | 1/1999 | Braden et al. ............... 118/261 |
| 5,897,337 A | 4/1999 | Kata et al. ................... 438/114 |
| 6,017,025 A * | 1/2000 | Balz et al. .................. 269/48.1 |
| 6,164,448 A | 12/2000 | Schmutz et al. ............ 206/488 |
| 6,300,590 B1 | 10/2001 | Lauer et al. .............. 219/121.6 |
| 2002/0149136 A1 | 10/2002 | Baird et al. .................. 264/400 |
| 2004/0094450 A1 * | 5/2004 | Whiteman et al. .......... 206/701 |

* cited by examiner

Primary Examiner—M. Alexandra Elve
(74) Attorney, Agent, or Firm—Stoel Rives LLP (57) ABSTRACT

A laser beam (102) cuts through a component carrier mask (96) made of thin elastomeric material such as silicone rubber to form slots (98) having slot openings of a desired shape. In a preferred embodiment, a light absorptivity enhancement material such as iron oxide introduced into the silicone rubber causes formation of a flexible support blank that operationally adequately absorbs light within a light absorption wavelength range. A beam positioner (106) receiving commands from a programmed controller causes a UV laser beam of a wavelength that is within the light absorption wavelength range to cut into the mask multiple slots with repeatable, precise dimensions. Each of the slots cut has opposed side margins that define between them a slot opening of suitable shape to receive a miniature component (10) and to exert on it optimal holding and release forces.

21 Claims, 10 Drawing Sheets

METHOD OF FORMING DIMENSIONALLY PRECISE SLOTS IN RESILIENT MASK OF MINIATURE COMPONENT CARRIER

RELATED APPLICATIONS

This patent application derives priority from U.S. Provisional Application No. 60/416,311 filed Oct. 4, 2002.

COPYRIGHT NOTICE

© 2003 Electro Scientific Industries, Inc. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

This invention relates to carriers for miniature components and, in particular, to a laser-based method of forming in a miniature component carrier dimensionally precise slots shaped to grip a miniature component and hold it in a controlled orientation.

BACKGROUND OF THE INVENTION

Figure 1:
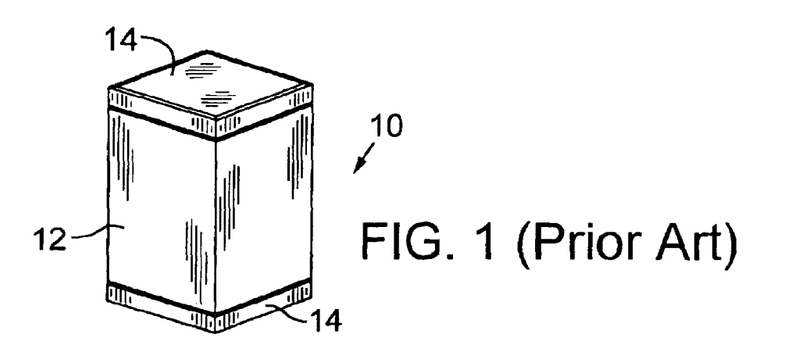
FIG. 1 is an enlarged isometric pictorial view of a capacitor chip.

Computers and other electronic equipment are becoming more powerful and can perform a wider range of tasks. To prevent growth in the sizes of the computers and other electronic equipment and operate them at higher speeds, the electronic circuits use miniature electronic components in high density packing arrangements. One such miniature electronic component, a solid state capacitor, is a tiny rectangular "chip" that is smaller than a grain of rice. FIG. 1 shows a capacitor chip 10 that has a solid enclosed body 12 of square or rectangular cross section and made of ceramic or other dielectric material. Capacitor chip 10 contains within body 12 multiple spaced-apart metal plates (not shown). One terminal end of each of alternate metal plates is connected to the exterior of body 12 and is adapted by a metallizing process to form a pair of spaced-apart mutually opposed electronic contact surfaces or ends 14. One or more of the contact surfaces 14 of chip capacitor 10 are striped with a solderable paste that is dried and then fired to produce surfaces that later can be soldered directly onto a circuit board. U.S. Pat. No. 5,226,382 describes a machine for placing a stripe or trace of solderable paste on surfaces of a chip and drying the paste so that the paste can later be fired. This machine uses a metal carrier belt or tape in which slotted rubber masks are formed. The slots in the masks receive chips in position for processing, such as covering opposed ends of the chips with solderable paste.

A relatively new electronic circuit chip is composed of multiple circuit components fit into a single array chip that is simultaneously solderable to one of a number of different electronic circuits. This device is called an Integrated Passive Component (IPC) or array chip because it comprises a plurality or array of circuit components, such as four or five separate capacitors stacked together in a single chip.

Figure 2A:
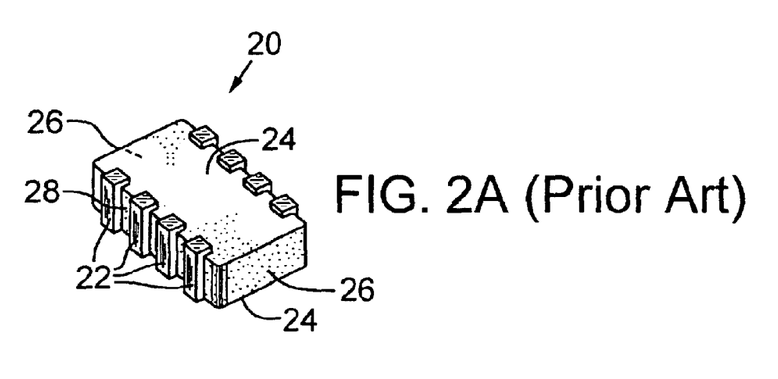
FIG. 2A is an enlarged isometric pictorial view of a typical integrated passive component or array chip coated with solderable paste.
Figure 2B:
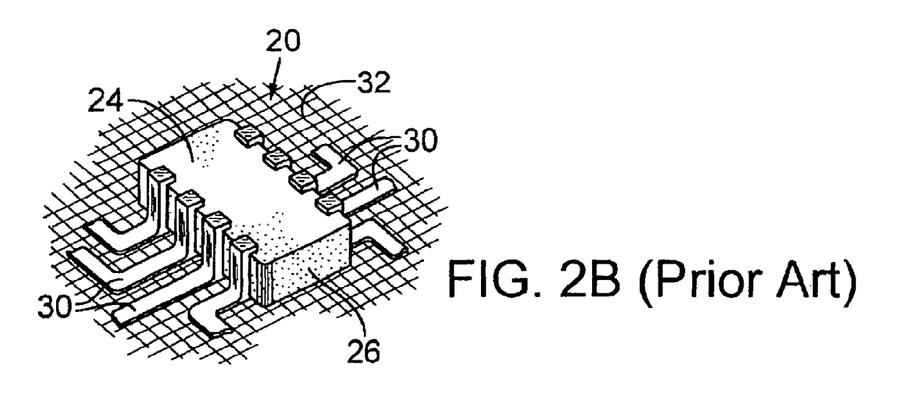
FIG. 2B is an enlarged isometric pictorial view of the array chip of FIG. 2A mounted on a surface of a circuit board.

FIG. 2A shows a typical IPC or array chip 20 with its side wall surfaces covered with stripes 22 of solderable paste. Array chip 20 has overall dimensions such as 3.2 mm (0.125 in) long and 1.5 mm (0.060 in) wide top and bottom surfaces 24, 1.5 mm (0.060 in) wide and 1.0 mm (0.040 in) high opposed end surfaces 26, and 1.0 mm (0.040 in) high and 3.2 mm (0.125 in) long opposed side surfaces 28. FIG. 2B shows that installing array chip 20 into an electronic circuit entails placing separate solderable paste stripes 22 along opposite wall surfaces, such as side surfaces 28 (as shown) or end surfaces 26 (not shown), and soldering paste stripes 22 to copper traces 30 formed on a circuit board 32. The width of each stripe 22 is typically set at 0.38±0.18 mm (0.015±0.007 in), with a 0.3±0.18 mm (0.012±0.007 in) turn-down edge at the end of each stripe along the adjacent wall as shown on top and bottom surfaces 24 in FIG. 2A. As with other chip components, after the paste is applied, it is subjected to a heat-drying cycle to set the paste and thereafter to a firing cycle to fuse the paste on array chip 20.

The small size of a chip and the small differences between its width and height dimensions raise the importance of handling the chip and its insertion into the mask of a carrier belt or tape. The multiple stripes are placed on only the appropriate circuit board surfaces, and their placement is accomplished with extreme accuracy. Splashing of the paste onto other surfaces of the chip would provide a site for a short circuit and thereby significantly degrade electronic equipment function. Accordingly, a feed device places the chip onto the carrier tape in a correct position and location, and the chip is handled correctly so that the appropriate surface is exposed in proper orientation to receive the stripes of paste within a specified accuracy.

There are two principal types of miniature component carriers that transport the components and present them for processing. A first type of carrier is an endless belt or tape that is typically used to carry single component chips, such as capacitor chips 10, which are larger than array chips. The endless tape is formed with a plurality of transversely oriented elongated apertures arranged centrally between and uniformly spaced apart along the marginal edges of the tape. Each of the apertures is adapted to receive in coplanar fixed registration a thin, resilient mask having at least one orifice and preferably a series of orifices of sizes and shapes to compliantly receive the chips in specific orientation so that their end surfaces intended for termination extend outwardly from the masks.

A second type of carrier is an endless belt that is typically used to carry array chips such as array chips 20. The belt has a core typically made of stainless steel with multiple apertures spaced apart along the belt length. A thin elastomeric material, such as silicone rubber, is molded over the stainless steel core to form a resilient mask. A slot is formed during the molding process in the resilient mask at locations where the over-molded elastomeric material covers the apertures.

Silicone rubber is difficult to aver mold onto the belt because silicone rubber flows well through small cracks in the mold. For this reason, slot openings with precise dimensions are difficult to form. The array chip component is held in the slot under compression by an interference fit. A 0.05 mm (0.002 in) desired interference fit nominally requires a ±0.025 mm (±0.001 in) slot opening tolerance range. For example, a 5.1 mm (0.20 in) thick array chip component typically requires a 0.43–0.48 mm (0.017–0.019 in) slot opening. A less than a −0.025 mm (−0.001 in) slot opening width tolerance results in a slot that is too tight, causing the silicone rubber nubs of the slot opening to deflect (rather than compress) and thereby cant the array chip component held in the slot. A slot opening width of greater than 0.025 mm (0.001 in) lets the component fall out of the belt.

The use of precision moldings typically provides a 25 percent initial yield in dimensionally accurate slot openings, and the belt needs to be reworked to increase the yield to a 65–80 percent nominal yield benchmark. Yield represents the number of chip components that remain in their associated slot openings during processing. Variations in the thickness dimension of the chip components also contribute to the relatively low yield achieved with the 0.05 mm (0.002 in) interference fit.

What is needed, therefore, is a method of accurately forming with high initial yields component slots in a miniature component carrier belt to precise dimensions and close tolerances.

SUMMARY OF THE INVENTION

An object of the invention is to provide a technique for cutting into a resilient mask of a miniature component carrier multiple slots of repeatable, precise dimensions and of shapes that compliantly grip miniature components and hold them in a controlled orientation.

The invention is preferably implemented with an ultraviolet (UV) laser beam that is directed to cut through a component carrier mask made of thin elastomeric material to form slots having slot openings of a desired shape. Silicone rubber is a preferred conventional elastomeric material used in the production of miniature component carriers. The formation of slots in the carrier belts is currently accomplished by injection molding techniques. A preferred embodiment of the present invention uses a UV laser beam to form by UV ablation a slotted resilient mask made of elastomeric material. UV ablation of the elastomeric material, which is preferably silicone rubber, ensures formation of slots of the required shape and dimensional quality. The absorption of conventional elastomeric materials, including silicone rubber, at the UV laser ablation wavelength region (shorter than about 400 nm) is insufficiently strong to cut slots at commercially acceptable throughput rates. To overcome this drawback, the method entails introducing a light absorptivity enhancement material into the silicone rubber to form a flexible support blank that operationally adequately absorbs light within a laser ablation wavelength region and using a UV laser beam to cut the slots. Iron oxide or titanium dioxide is a preferred dye dopant functioning as a light absorptivity enhancement material.

A beam positioner receives commands from a controller programmed to cause the laser beam to cut into the mask multiple slots with repeatable, precise dimensions. Each of the slots cut has opposed side margins that define between them a slot opening of suitable shape to receive a miniature component and to exert on it optimal holding and release forces. Slot openings of different shapes are used to accommodate miniature components having different configurations. A programmable controller can improve yield by processing slot opening dimensions customized to accept particular lots of chip components having known dimensions. Tailoring the slot openings to specific chip component sizes increases the likelihood of compliance with the tight interference fit dimension tolerance range.

A laser emitting light of wavelengths shorter than 550 nanometers and preferably light of ultraviolet (UV) wavelengths, is a preferred source of light emissions for constructing a slotted component carrier made of silicon rubber doped with iron oxide or titanium dioxide.

Additional objects and advantages of this invention will be apparent from the following detailed description of preferred embodiments thereof which proceeds with reference to the accompanying drawings.

Additional aspects and advantages of this invention will be apparent from the following detailed description of preferred embodiments, which proceeds with reference to the accompanying drawings.

DETAILED DESCRIPTION OF PREFERRED EMBODIMENTS

Figure 3:
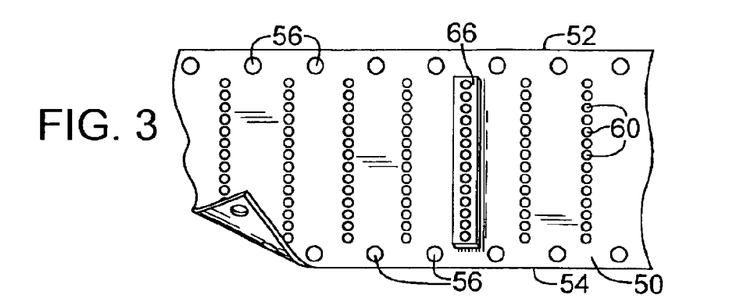
FIG. 3 is a fragmentary top plan view of a component carrier tape in which a series of apertures carries masks that hold chip components.
Figure 4:
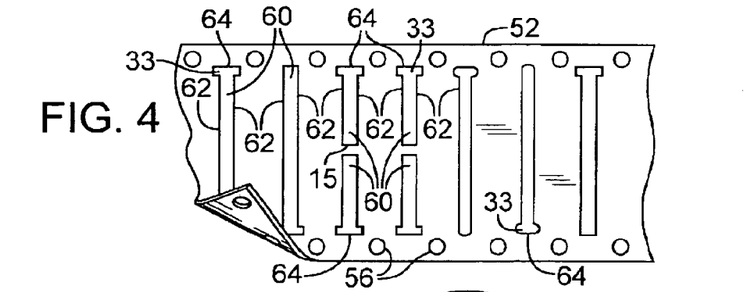
FIG. 4 is a fragmentary plan view showing a carrier tape having a variety of different apertures.
Figure 5:
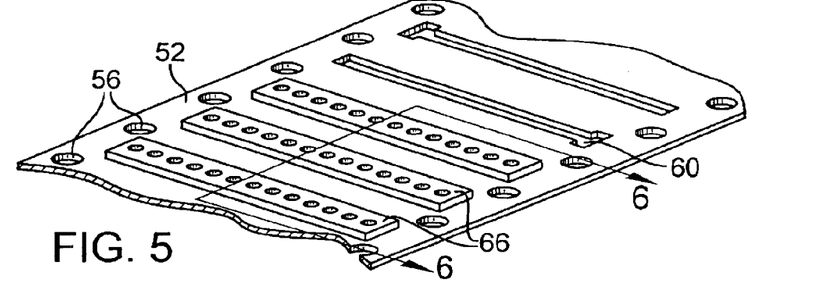
FIG. 5 is a fragmentary isometric view of a carrier tape carrying masks that are formed over the apertures.
Figure 6:
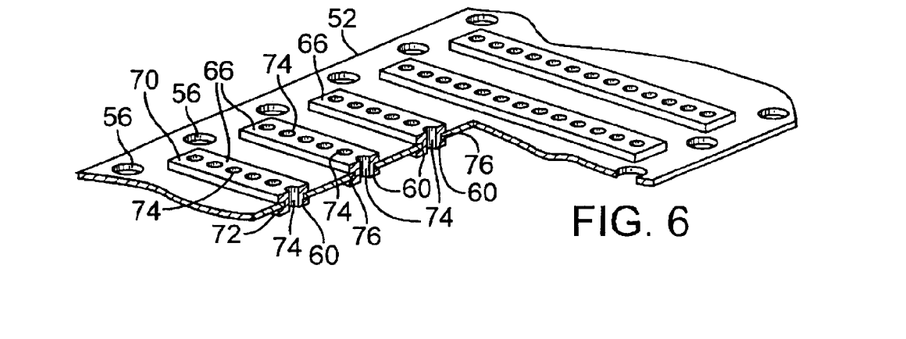
FIG. 6 is a sectional view of the carrier tape and masks taken along lines 6—6 in FIG. 5.

FIG. 3 shows an endless component carrier in the form of a flexible metal tape of stainless steel or other high strength metal that is approximately 0.13 mm (0.005 in) thick and about 5.1 cm (2.0 in) wide. Tape 50 is of an "endless" variety in that it has no beginning or end but is maneuvered about a series of pulleys and sprocket wheels between various processing stations such as described in U.S. Pat. No. 5,226,382. Tape 50 is defined by spaced-apart mutually parallel side margins 52 and 54 and includes a series of pilot or sprocket holes 56 that serve as drive perforations to receive drive stubs of drive sprocket wheels (not shown). Sprocket holes 56 are disposed adjacent at least one and preferably both of side margins 52 and 54 and are uniformly spaced along the length of tape 50. FIG. 4 shows tape 50 formed with a variety of apertures of different shapes into which a mask can be inserted. Multiple first apertures 60 formed in discrete patterns are spaced uniformly along the length of tape 50, preferably positioned intermediate of side margins 52 and 54. Apertures 60 may be a series of closely spaced round holes as shown in FIG. 3, a series of elongated rectangular openings as shown in the end portions of FIG. 4, or a series of elongated openings in repeated patterns in a side-by-side arrangement as shown in the center portion of FIG. 4. In a configuration of other than round holes, apertures 60 are generally defined by a pair of spaced-apart elongated side edges 62 terminated by a pair of short-end edges 64. Each of apertures 60 receives a mask 66 that is of a size and shape to remain fixed to tape 50 and carry multiple chip components. "Mask" is the term used in the art to define an element made of silicone rubber or other resilient material that surrounds and partly encloses a chip component during some stage of its fabrication process. The purpose of mask 66 is to provide a generally elongated resilient-walled holder in which a chip component may be temporarily held during the process of metallizing its opposite ends. An example of a chip capacitor of a type amenable to transport by tape 50 is shown in FIG. 1.

Figure 7:
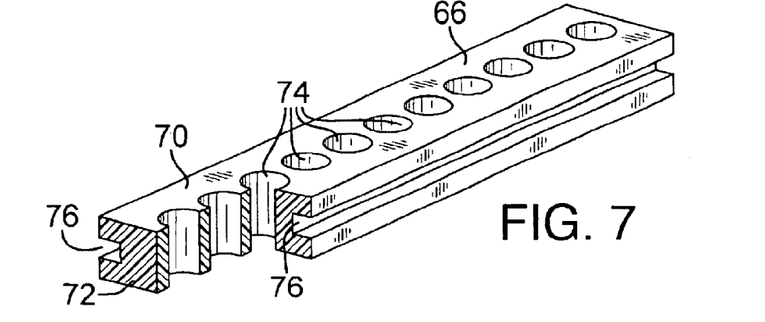
FIG. 7 is a fragmentary isometric view of an exemplary pattern of apertures formed through the masks of FIG. 6 for carrying chip components.

FIG. 7 shows that mask 66 is defined by a pair of spaced-apart top and bottom exterior surfaces 70 and 72 that, when mask 66 is fixed in place on tape 50, lie, respectively, above and below and coplanar with the surfaces at tape 50. In its simplest form, shown in FIG. 3, each mask 66 is cast in place about an aperture 60 so that a plurality of masks 66 may be arranged in a pattern parallel or transverse to the longitudinal axis of tape 50. One or more second apertures 74 of a size smaller than that of first aperture 60 are formed in each mask 66 to keep the metal core of tape 50 out of contact with the chip component. The size of second apertures 74 is slightly smaller than that of the chip component in at least one direction so that the chip component can be positionally accepted and resistively grasped during advancement of the chip component from one processing stage to another. Mask 66 is defined, in addition to top and bottom surfaces 70 and 72, by a pair of opposed elongated slots 76 positioned intermediate of top and bottom surfaces 70 and 72 for receipt of first aperture elongated side edges 62 formed in tape 50. The length of a removable mask 66 is less than the width of tape 50 and is preferably less than the distance between adjacent sprocket holes 56.

Figure 8A:
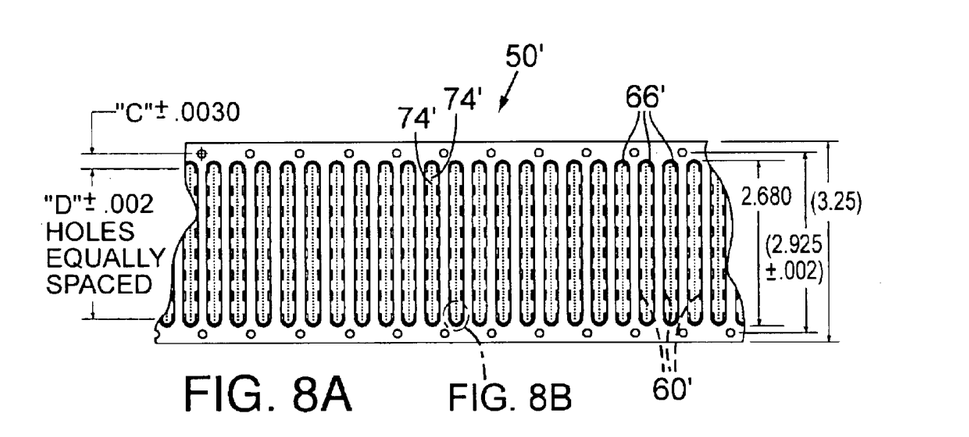
FIG. 8A is a plan view of an alternative type of carrier tape to that of the carrier tape of FIG. 3.
Figure 8B:
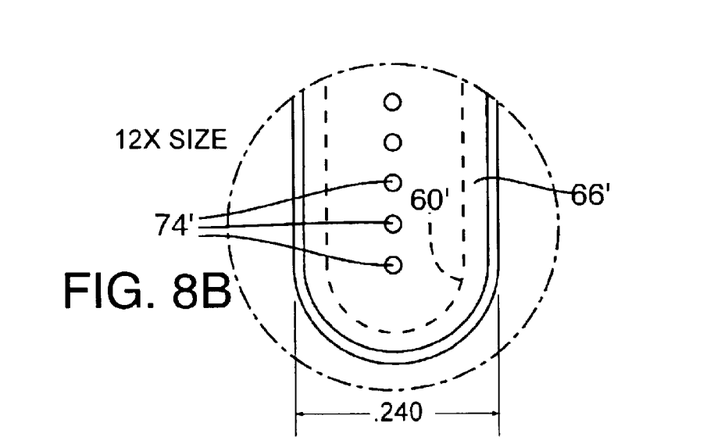
FIG. 8B is an enlarged fragmentary view of the component holding apertures in the mask strips of the carrier tape of FIG. 8A.

FIGS. 8A and 8B are respective plan and enlarged fragmentary views of an alternative component carrier tape 50' that is similar to tape 50 with the exception that silicone rubber mask strips 66' are molded into or coated over apertures 60' of generally rectangular shape with curved ends in a core portion. Apertures 74' are formed in a single row in each mask strip 66' along the width of carrier tape 50'.

Figure 9A:
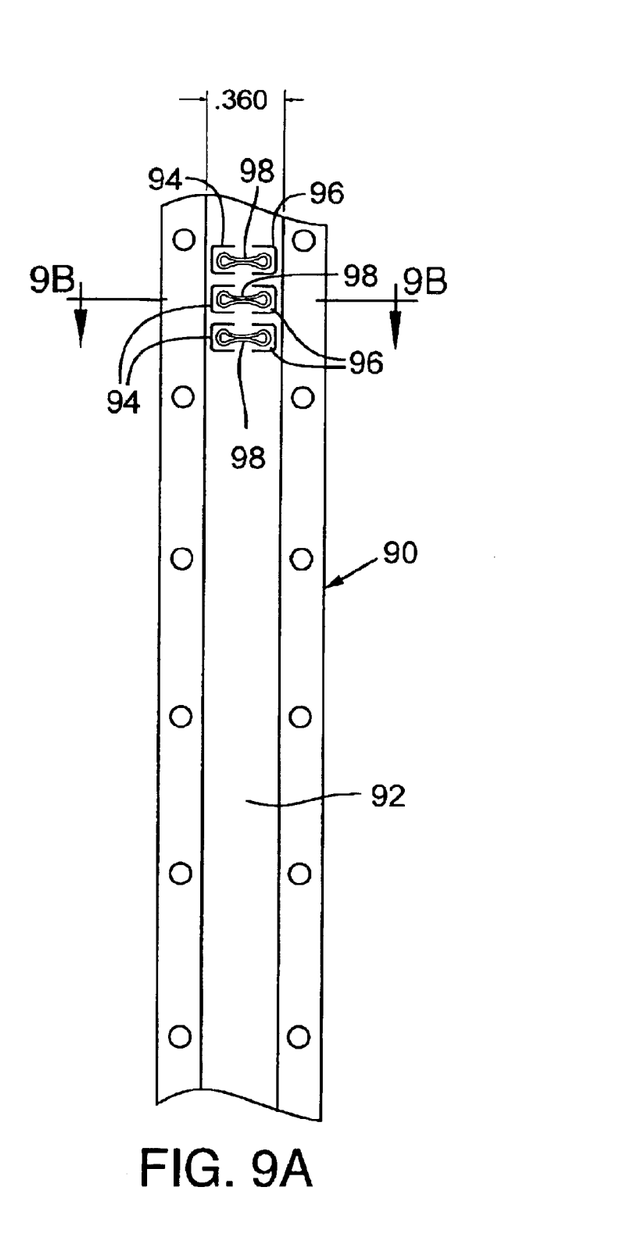
FIG. 9A is a plan view of an over-mold or over-coat type of carrier tape.
Figure 9B:
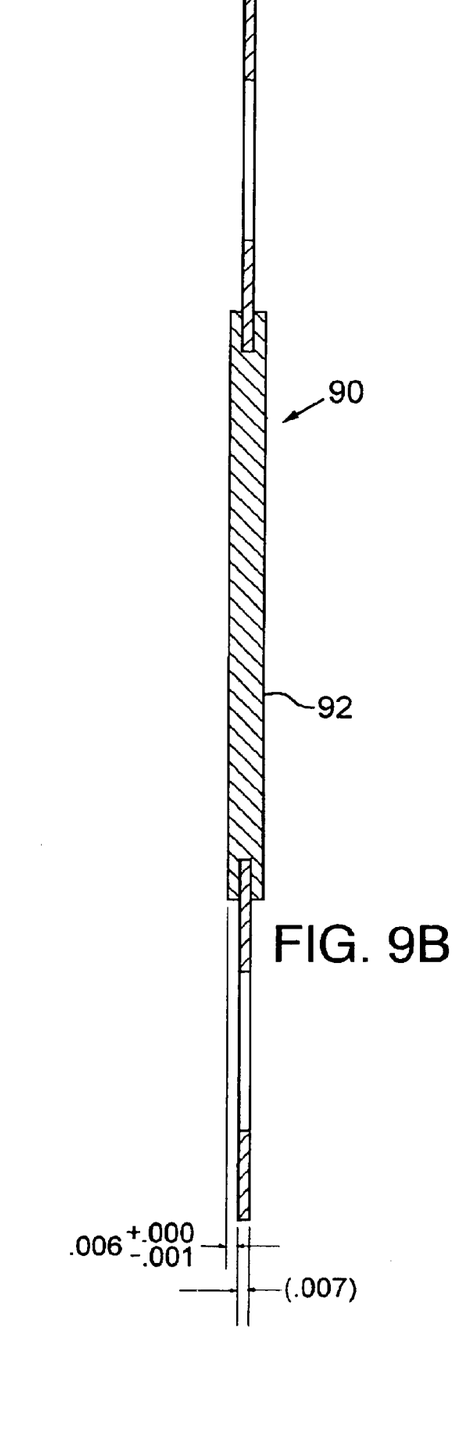
FIG. 9B is an enlarged sectional view taken along lines 9B—9B of FIG. 9A.

FIGS. 9A and 9B are respective plan and enlarged sectional views of a component carrier tape 90 of an over-mold or over-coat type in which a core portion 92 having multiple apertures 94 spaced apart along the tape length is covered by a support blank of thin elastomeric material to form a mask 96. A single slot 98 is cut in mask 96 at each location where the elastomeric material covers an aperture 94.

Figure 10A:
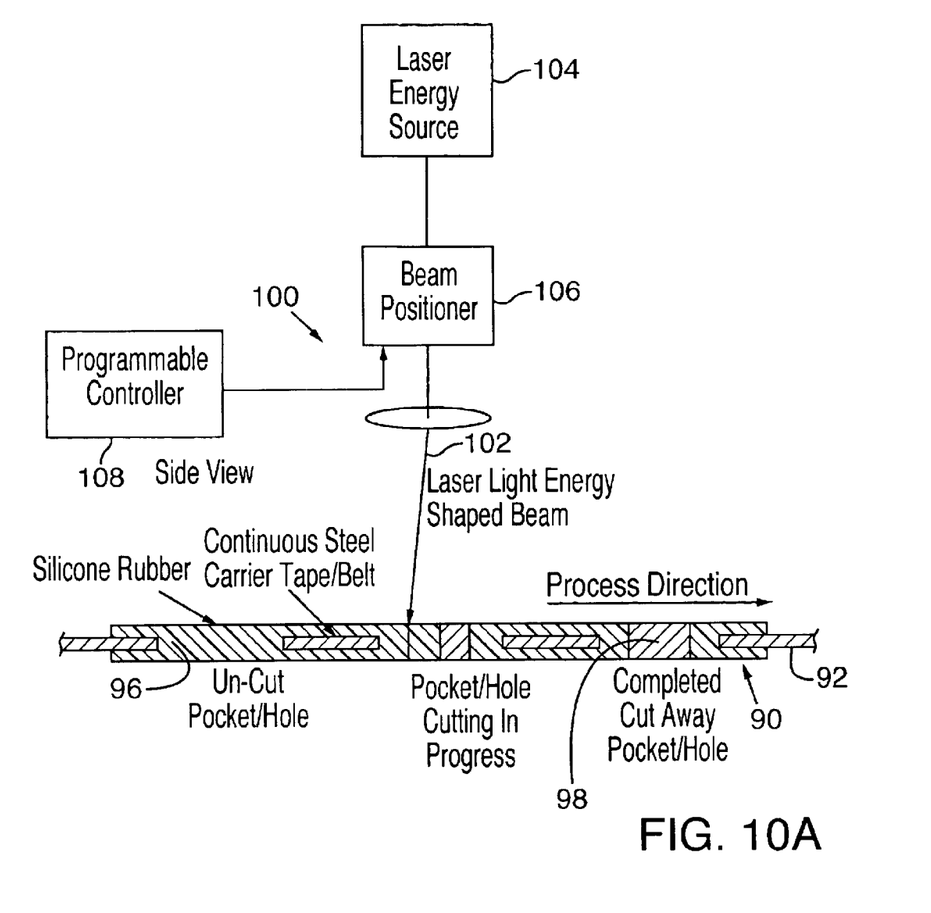
FIGS. 10A and 10B are, respectively, a simplified pictorial diagram of a laser-based system shown cutting a slot in a carrier tape and a pictorial view of an endless carrier tape routed around two spaced-apart sets of stacked spools and made in accordance with the present invention.

FIG. 10A is a simplified pictorial diagram of a laser-based system 100 showing by way of example the cutting of a slot 98 in a carrier tape 90 in accordance with the present invention. Light energy propagating in the form of a shaped beam 102 from a laser 104 is incident on and controllably guided by a beam positioner 106 about the surface of mask 96 at a location of an aperture 94 to cut a slot 98 of a desired shape with precise dimensions. Beam positioner 106 guides beam 102 in response to signals produced by a programmable controller 108, such as the controller installed as part of a Model 5320 Via Drilling System sold by Electro Scientific Industries of Portland, Oreg., the assignee of this patent application. A tape feed mechanism (not shown) moves carrier tape 90 to align its apertures 94 with beam 102 to cut slots 98. Carrier tape 90 is preferably in the form of an endless tape shown in FIG. 10B, and a suitable tape feed mechanism is the tape feed mechanism installed as part of a Model 750 Belt Termination System, also sold by Electro Scientific Industries. The cutting of slots 98 in mask 96 is achieved by providing a mask 96 having light absorption wavelength range with which the wavelengths of laser beam 102 operationally overlap.

The support blank forming mask 96 includes a composition of elastomeric material and a light absorptivity enhancement material. The elastomeric material imparts elastic properties to the support blank to make it flexible. Because the elastomeric material, such as silicone rubber, operationally inadequately absorbs light energy to cut a slot, the light absorptivity enhancement material, such as iron oxide or titanium dioxide, imparts light absorptivity properties to the support blank to make it operationally adequately absorb light energy included within a light absorption wavelength range to cut the slots but not to change the elastic properties imparted by the elastomeric material. The light emission wavelengths of beam 102 are preferably shorter than 550 nm, and 266 nm is a preferred wavelength for cutting slots in a mask 96 formed of silicone rubber doped with iron oxide.

Figure 11:
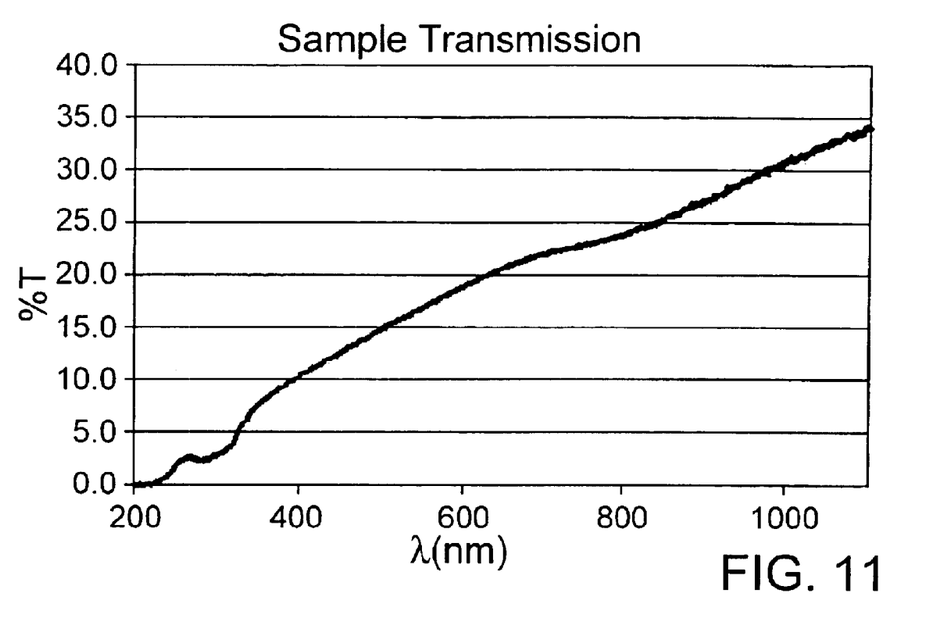
FIGS. 11 and 12 show as a function of wavelength the optical transmission curves for, respectively, silicone rubber and silicone rubber doped with iron oxide.
Figure 12:
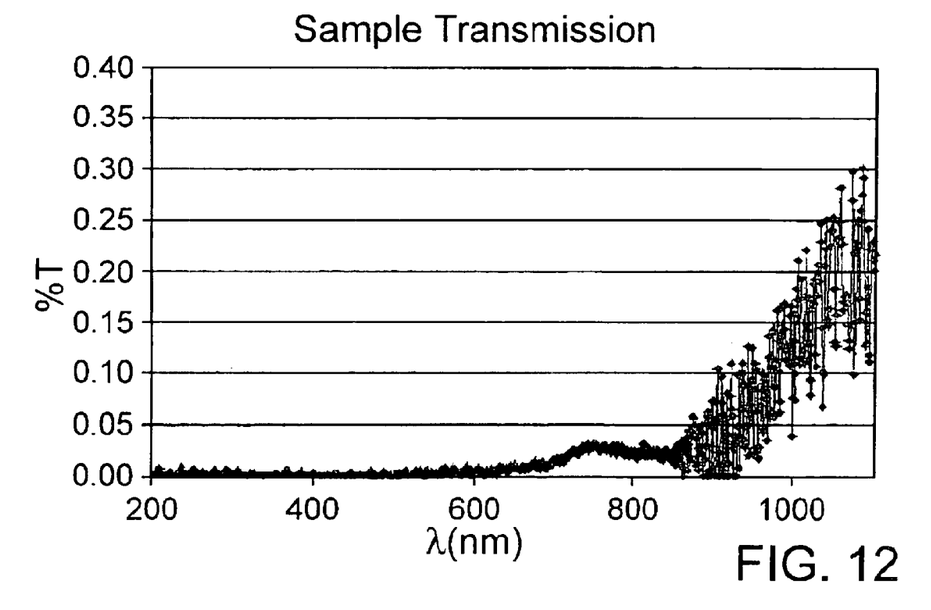

In a preferred embodiment, the support blank forming mask 96 is prepared from a liquid formulation of silicone rubber (99 percent by weight) and iron oxide (1 percent by weight) to provide silicone rubber with a brown color without changing its elastic properties. FIGS. 11 and 12 show as a function of wavelength the optical transmission (absorptivity) curves for 0.356 mm (0.014 in) thick samples of, respectively, silicone rubber and silicone rubber doped with iron oxide (1 percent weight). FIG. 11 shows for undoped silicone rubber about 3 percent and about 17 percent light transmission at 266 nm and 550 nm, respectively. FIG. 12 shows for silicone rubber doped with iron oxide about 0.01 percent light transmission at 266 nm and 550 nm. The 3 percent light transmission by the undoped silicone rubber is sufficient to render operationally inadequate light absorption to cut slots in a silicone rubber support blank.

Figure 10B:
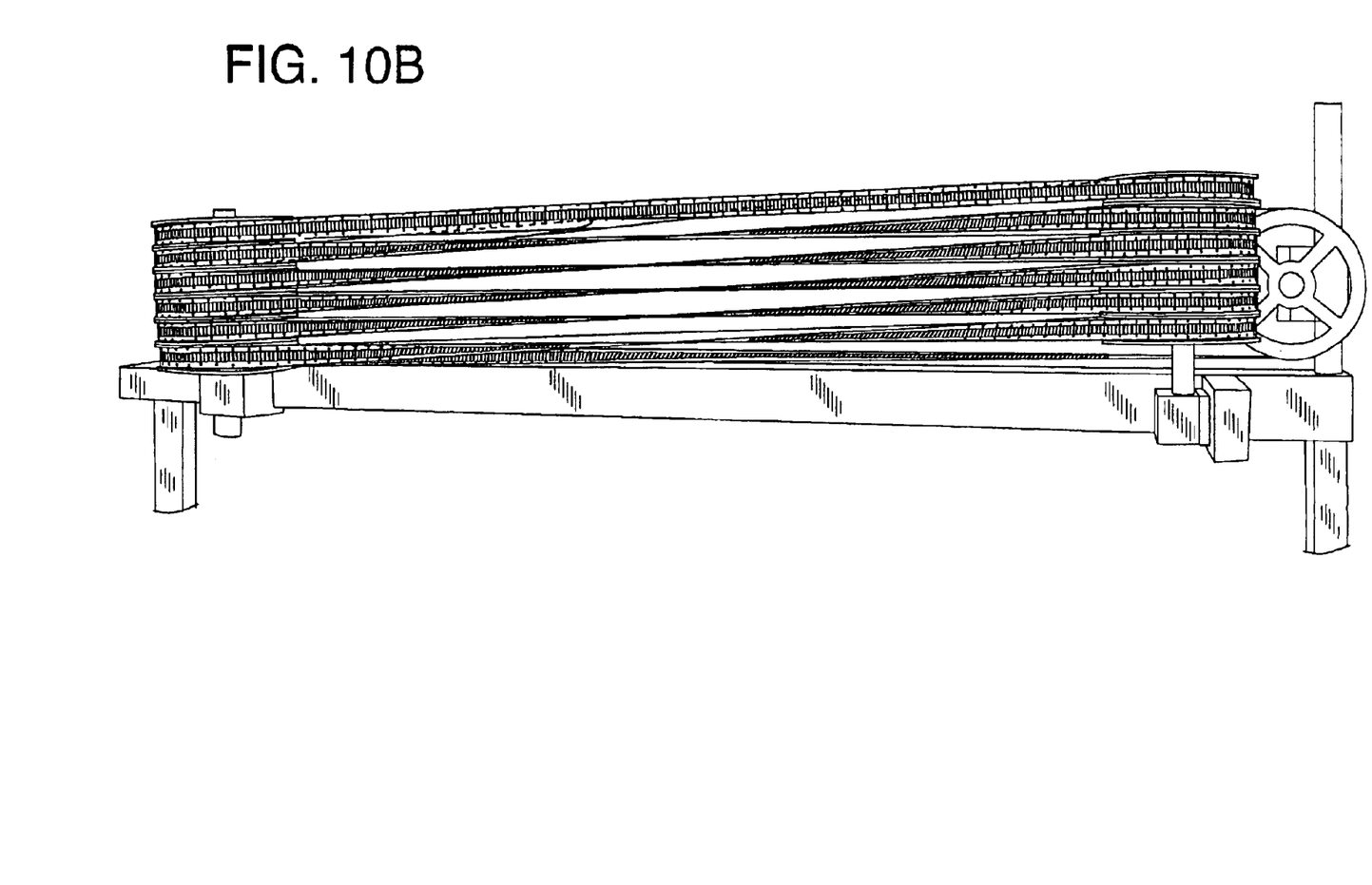

As indicated in FIGS. 10A and 10B, carrier tape 90 formed with a rubber surface without surface features is placed on processing equipment of laser-based system 100. Laser beam 102 of sufficient energy cuts into mask 96 slots or pockets 98 into the rubber at the locations of apertures 94. Programmable controller 108 of system 100 is implemented with software to control the geometry of the slots, the shapes and sizes of which are determined by the end use application (i.e., sizes and shapes of chip components).

The power and wavelength of laser beam 102 are controlled to keep the heat generated during cutting below the point of damage to the silicone rubber. An example of laser pulse parameters is a 355 nm UV laser operating with 2.85 watt emissions at a 15 KHz pulse repetition rate. Cutting into a 0.356 mm (0.014 in) thick carrier tape 90 a rectangular bar of 3.05 mm (0.12 in)×0.711 mm (0.028 in) dimensions at a 75 mm/sec feed speed and a 5 μm laser beam bite size takes 35 pulse repetitions and 3.51 seconds to complete.

Figure 13A:
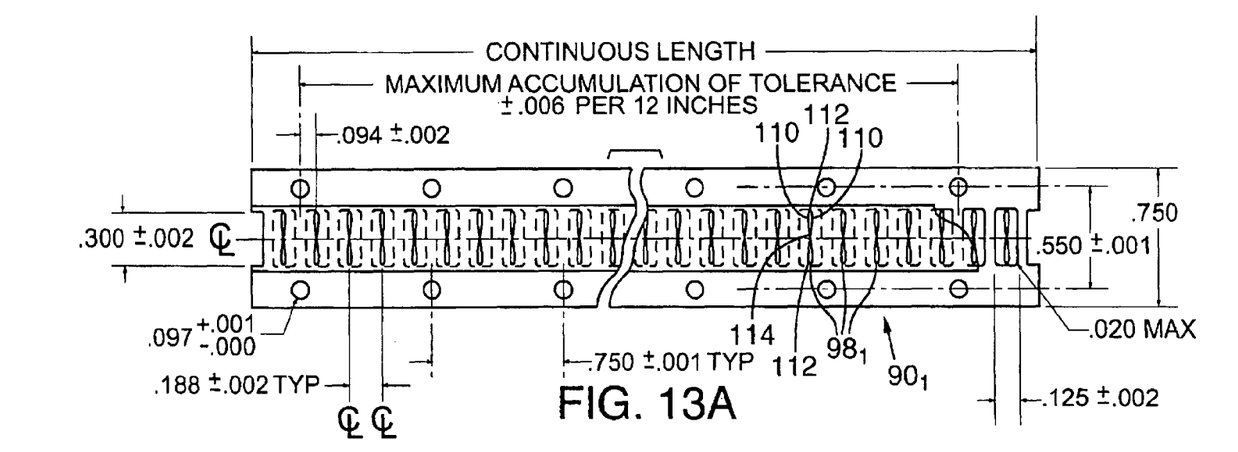
FIGS. 13A and 13B, are, respectively, a diagram of a carrier tape in which slots of a dog bone or bow tie shape are cut and pictorial view of portions of the carrier tape and its slots.
Figure 13B:
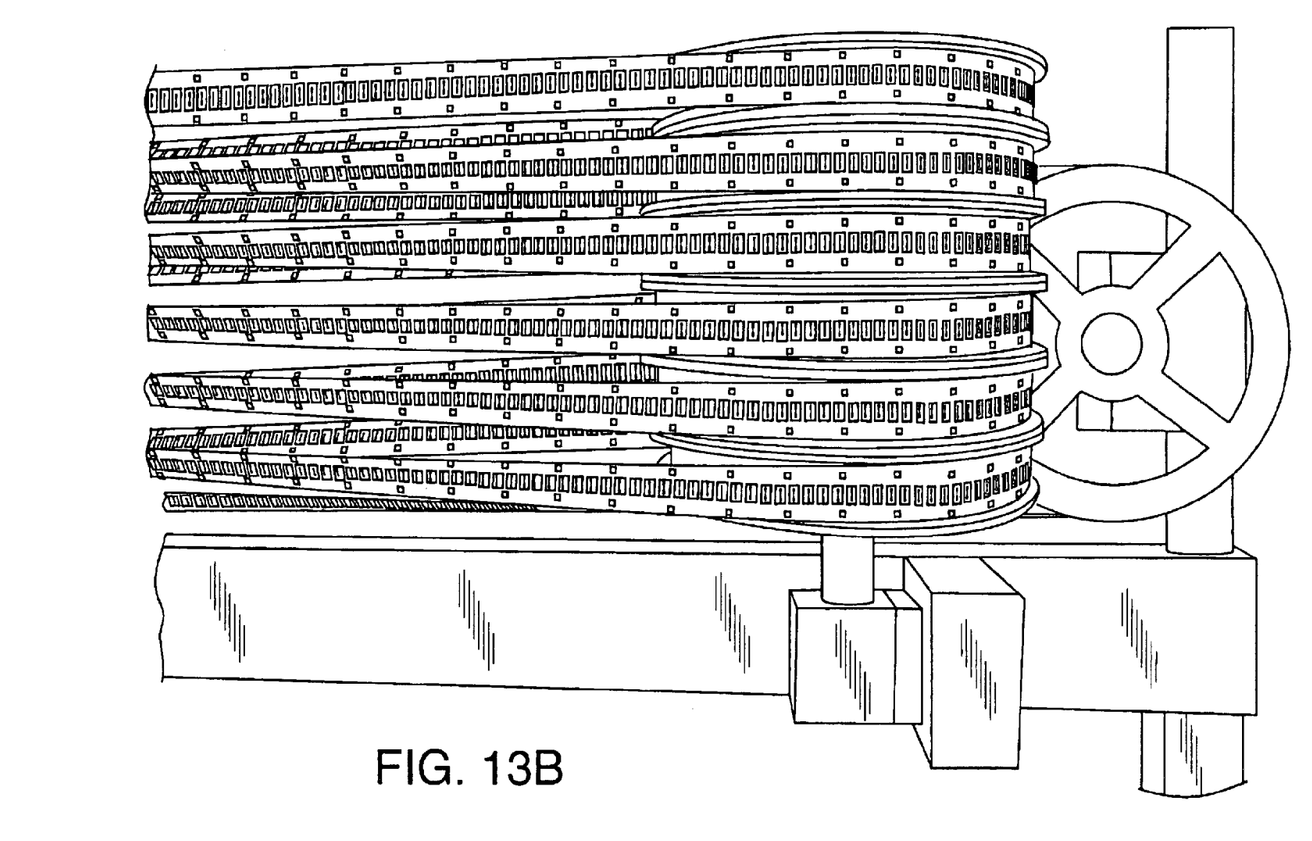
Figure 14A:
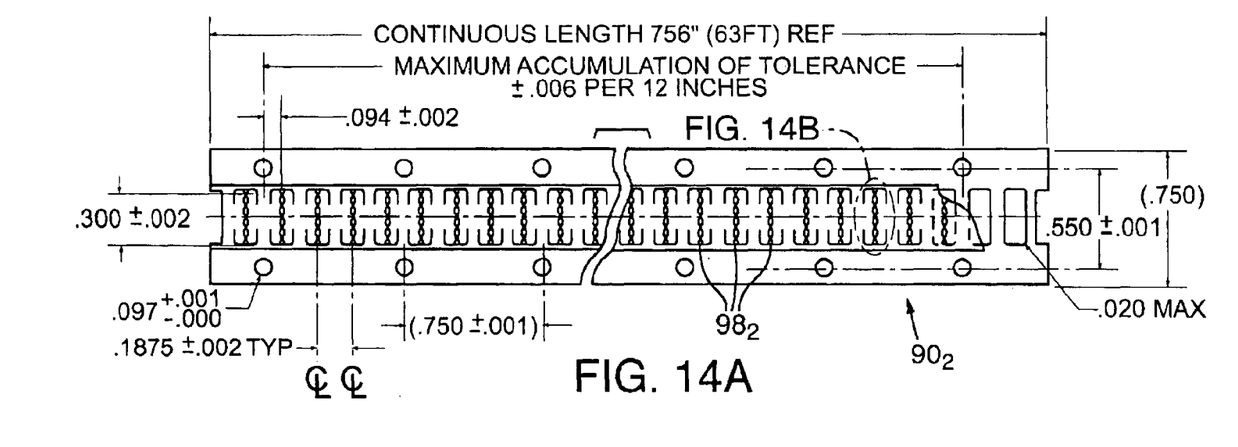
FIG. 14A shows a carrier tape in which slots of a sawtooth shape are cut.
Figure 14B:
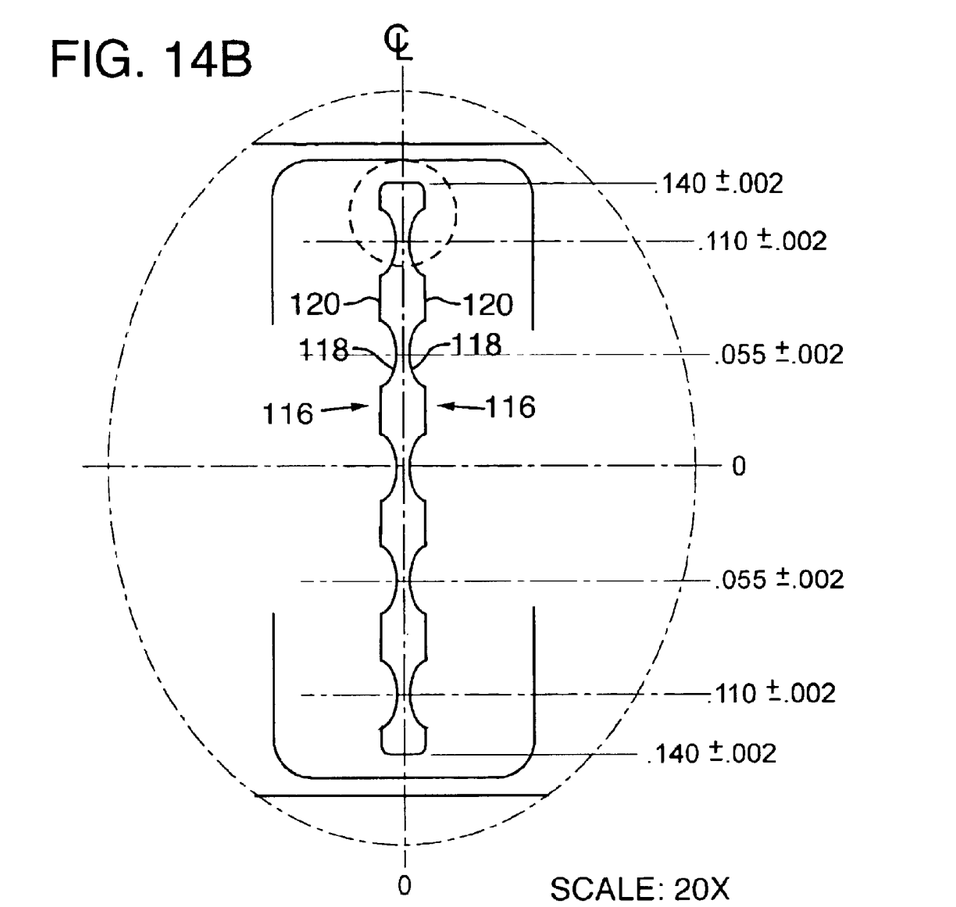
FIG. 14B is an enlarged view of one of the slots in the carrier tape of FIG. 14A.

FIGS. 13A and 13B and FIGS. 14A and 14B show tapes having slots of different geometries. FIGS. 13A and 13B show a tape $90_1$ in which each of tapered slots $98_1$ is of a "dog bone" or "bow tie" shape. Tapered slots $98_1$ are produced by cuts that form in tape $90_1$ opposed slot side margins 110 separated along their lengths by longer slot distances at opposite ends 112 and a shorter distance at a medial location 114 between ends 112. In a preferred embodiment, the slot distances become gradually smaller from opposite ends 112 to medial location 114. FIGS. 14A and 14B show a tape $90_2$ in which each of slots $98_2$ is of a "sawtooth" shape. Slots $98_2$ are produced by cuts that form in tape $90_2$ opposed slot side margins 116 separated along their lengths by alternating shorter and longer distances that form corresponding alternating narrower and wider openings. In a preferred embodiment, the narrower openings are in the general form of concave tapered segments 118 and the wider openings are in the general form of parallel straight line segments 120.

It will be obvious to those having skill in the art that many changes may be made to the details of the above-described embodiments of this invention without departing from the underlying principles thereof. The scope of the present invention should, therefore, be determined only by the following claims.

It will be obvious to those having skill in the art that many changes may be made to the details of the above-described embodiments without departing from the underlying principles of the invention. The scope of the present invention should, therefore, be determined only by the following claims.

What is claimed is:

1. In a miniature component carrier having a thin, resilient mask through which multiple slots are formed, each of the multiple slots being of nominal size and shape to compliantly receive and hold a miniature component, a method of forming the slots in the resilient mask, comprising:

providing a support blank of thin elastomeric material that is flexible and operationally adequately absorbs light included within a light absorption wavelength range, the support blank including a composition of an elastomeric material and a light absorptivity enhancement material, the elastomeric material imparting elastic properties to the support blank to make it flexible and the light absorptivity enhancement material imparting light absorptivity properties to the support blank to make it operationally adequately absorb light included within the light absorption wavelength range but not to operationally change the elastic properties;

providing a laser beam of a wavelength that is included within the light absorption wavelength range;

directing the laser beam to the support blank; and moving the laser beam and support blank relative to each other such that the laser beam is incident on the support blank to cut multiple slots with repeatable, precise dimensions and thereby form a slotted resilient mask, each of the slots cut to have opposed slot side margins shaped to grip between them a miniature component and hold it in a controlled orientation.

2. The method of claim 1, in which the light absorptivity enhancement material includes iron oxide or titanium dioxide.

3. The method of claim 2, in which the light absorption wavelength range includes wavelengths shorter than about 550 nm.

4. The method of claim 1, in which the light absorptivity enhancement material includes a dye or a pigment.

5. The method of claim 1, in which the elastomeric material includes silicone rubber.

6. The method of claim 5, in which the laser beam has a wavelength of about 355 nm.

7. The method of claim 1, in which each of the multiple slots has a slot length and opposite ends between which the opposed slot side margins extend, the opposed side margins being separated along their slot lengths by slot distances, the slot distances including longer distances at the opposite ends and a shorter distance at a medial location between the opposite ends.

8. The method of claim 7, in which the slot distances at the opposite ends and the slot distance at the medial location for each slot are, respectively, maximum and minimum distances separating the opposed slot side margins along their slot lengths.

9. The method of claim 7, in which the slot lengths of each slot are substantially the same and the slot distances from the opposite ends to the medial location differ by amounts to form a generally centrally tapered slot.

10. The method of claim 9, in which the generally centrally tapered slot is of a dog bone or bow tie shape.

11. The method of claim 1, in which each of the multiple slots has a slot length and opposite ends between which the opposed side margins extend, the opposed side margins being separated along their slot lengths by alternating shorter and longer distances that form corresponding alternating narrower and wider openings.

12. The method of claim 11, in which the narrower openings are in the general form of concave tapered segments and the wider openings are in the general form of parallel straight line segments.

13. The method of claim 12, in which the opposed side margins at the opposite ends of each slot are separated by the longer distances.

14. The method of claim 1, in which the miniature component carrier is in the form of a carrier tape having a tape length, the carrier tape including a core portion having multiple apertures spaced apart along the tape length and covered by the support blank of thin elastomeric material to form the resilient mask, the slots cut in the resilient mask at locations where the elastomeric material covers the apertures.

15. The method of claim 14, in which the carrier tape has opposite tape side margins running along the tape length and includes multiple drive holes mutually spaced apart along the tape length on each of the tape side margins.

16. The method of claim 14, in which the core portion of the carrier tape includes flexible metal into which the multiple apertures are formed.

17. The method of claim 16, in which the flexible metal includes stainless steel and the elastomeric material includes silicone rubber.

18. The method of claim 1, in which the miniature component carrier is in the form of a carrier belt having a belt length, the carrier belt including multiple apertures each of which adapted to receive one of the support blanks of thin elastomeric material to form the resilient mask into which multiple slots are cut.

19. The method of claim 18, in which the multiple slots of each support blank of thin elastomeric material received by the carrier belt are aligned in a direction transverse to the belt length.

20. The method of claim 18, in which the carrier belt is of an endless type and includes flexible metal in which the multiple apertures are included.

21. The method of claim 20, in which the flexible metal includes stainless steel and the elastomeric material includes silicone rubber.

* * * * *